(12) United States Patent
Ocola

(10) Patent No.: US 6,610,464 B2
(45) Date of Patent: Aug. 26, 2003

(54) PROCESS FOR PATTERNING A MEMBRANE

(75) Inventor: Leonidas E. Ocola, Flanders, NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/863,437

(22) Filed: May 24, 2001

(65) Prior Publication Data

US 2002/0187433 A1 Dec. 12, 2002

(51) Int. Cl.[7] .............................. G03F 9/00; G03F 7/00; G03D 5/00
(52) U.S. Cl. .................. 430/322; 430/5; 430/296; 430/311; 430/935; 430/942; 427/498
(58) Field of Search ................. 427/498, 240; 430/5, 296, 935, 942, 311

(56) References Cited

U.S. PATENT DOCUMENTS

| | | | |
|---|---|---|---|
| 5,066,616 A | * 11/1991 | Gordon | 438/780 |
| 5,260,151 A | 11/1993 | Berger et al. | |
| 5,291,536 A | * 3/1994 | Itoh et al. | 430/5 |
| 5,529,862 A | * 6/1996 | Randall | 430/5 |
| 5,609,995 A | * 3/1997 | Akram et al. | 430/311 |
| 6,033,135 A | 3/2000 | An et al. | |

* cited by examiner

*Primary Examiner*—Mark F. Huff
*Assistant Examiner*—Kripa Sagar
(74) *Attorney, Agent, or Firm*—Harness, Dickey and Pierce, P.L.C.

(57) ABSTRACT

A process for patterning a non-rigid membrane in a closed gap environment including the optional step of applying a solvent to the non-rigid membrane, applying a layer of an energy-sensitive composition to the non-rigid membrane, spinning the non-rigid membrane, inverting the non-rigid membrane with the layer of an energy-sensitive composition, spinning the inverted non-rigid membrane, re-inverting the non-rigid membrane, and spinning the re-inverted, non-rigid membrane. As a result of the inverting step and the inverted spinning step, the layer of an energy-sensitive composition does not cause the non-rigid membrane to sag and the resulting layer of energy-sensitive composition is substantially uniform in thickness. The energy-sensitive composition may be a photoresist, such as a chemically amplified photoresist.

12 Claims, 8 Drawing Sheets

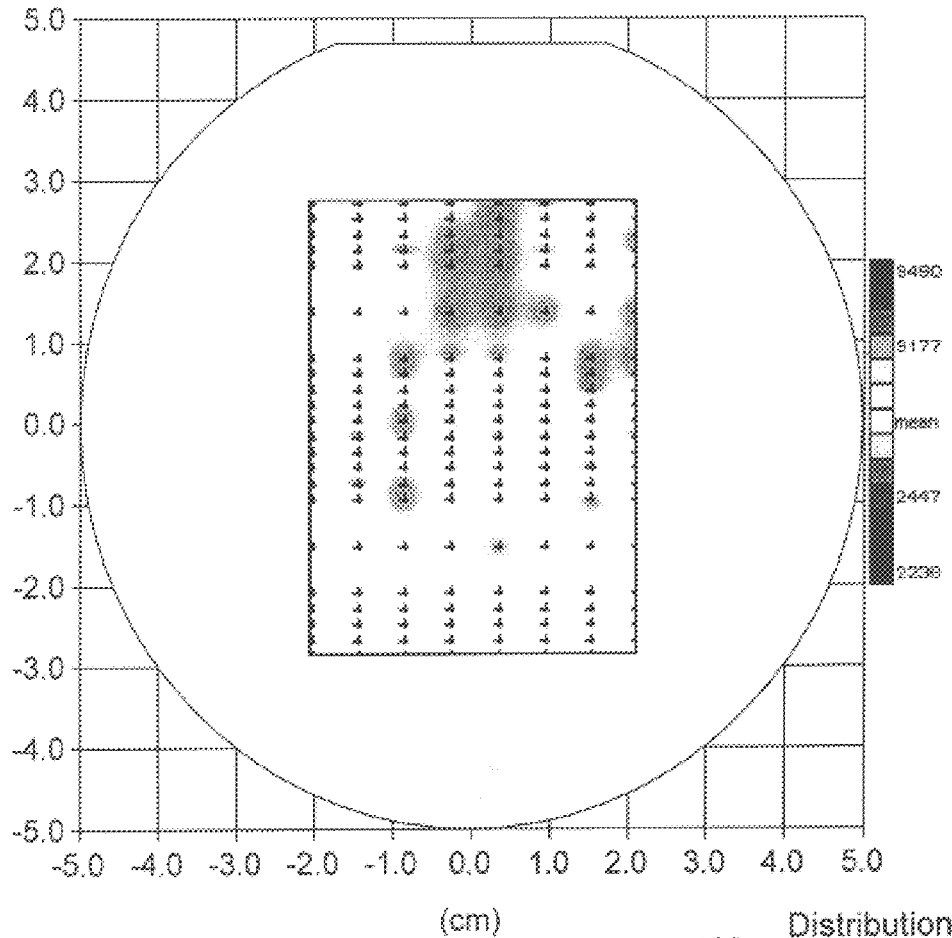
FIG. 7b
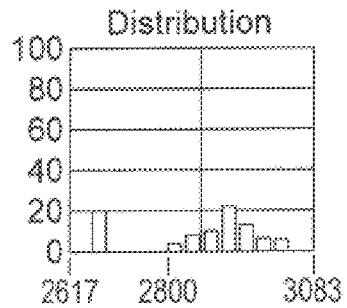

PROCESS FOR PATTERNING A MEMBRANE

TECHNICAL FIELD

The present invention relates to the field of lithography and in particular, to a method of patterning a membrane.

BACKGROUND ART

In lithography, a photoresist is formed on a substrate and an image of a desired pattern is introduced into the photoresist. In order for the pattern to have the desired accuracy, it is desirable for the photoresist to have uniform thickness.

Typically, the substrate is rigid. U.S. Pat. No. 6,033,135 to An et al. describes inverting and spinning a rigid substrate. In some applications (such as a SCALPEL mask), the substrate is a thin, non-rigid membrane mask. U.S. Pat. No. 5,260,151 to Berger et al. describes a SCALPEL membrane mask.

A problem with a membrane mask is that the membrane mask has a tendency to bow under the weight of the photoresist, resulting in a photoresist of non-uniform thickness. FIG. 1 illustrates a membrane mask 10 supported by a support structure 20. As illustrated, when photoresist 30 is coated on top of the membrane mask 10, the weight of the photoresist 30 makes the membrane mask 10 sag in areas 12 between the struts 22 of the support structure 20. As a result, the photoresist 30 is thicker in area 32, between the struts 22 of the support structure 20, than in area 34. The resist non-uniformities caused by the sagging causes streaking regions in the final product.

Further, current spin coat application requires that the resist is coated on the membrane as a thick substrate arrangement and then spun. The role of the spin motion during spin coating is two-fold: first, to spread the film by centrifugal force and second, to dry the film as the solvent evaporates from the surface. The thickness non-homogeneity caused by the application of the photoresist, illustrated in FIG. 1, is worsened by the spin motion during spin coating.

FIGS. 2–3 also illustrate masks made by conventional spin coat processes mentioned above. FIG. 2 illustrates an example of spincast thin film non-uniformity caused by membrane sag. The zoomed portion of FIG. 2 shows how film thickness modulation over a mask membrane changes from a center of the mask to edges of the mask. In particular, the zoomed portion of FIG. 2 shows a "narrower" window 100, a "wider" window 102, and a resist streak 104.

FIG. 3 illustrates the effect of changing drying characteristics in a spin casting process. The recipe used for FIG. 3 was the same as for FIG. 2, except a cover of the spinner was on during the spread, coat, and dry stages. FIG. 3 illustrates resists streaks 104 as well as a stretched resist image 106 of the grid. It is evident from FIG. 3 that the film acquires a shape and then "stretches" during the spread and dry spin stage. It is also evident from FIG. 3 that the thickness modulation pattern extends beyond the mask membrane area.

SUMMARY OF THE INVENTION

The present invention is directed to a process for depositing an energy-sensitive composition, such as a photoresist or other energy-definable material on a non-rigid membrane substrate, where the non-rigid membrane substrate is flipped as part of a spin-casting process.

The present invention solves the problem described above with conventional processes by applying a photoresist on a membrane substrate, spinning the membrane substrate right side up to wet the membrane substrate with the photoresist, then further spinning with the membrane substrate inverted so that the photoresist-coated membrane substrate is upside down. The upside down membrane substrate does not bow in response to the weight of the photoresist.

The photoresist is further spun substantially upside down in a "closed-gap" environment. A closed-gap environment usually has a gap of 2 mm or less between the photoresist and a spinning chuck. The closed gap inhibits turbulence and limits evaporation of the photoresist during spinning because the small gap inhibits air convection.

The photoresist wets the membrane substrate surface, which ensures that the applied photoresist does not drip off the membrane substrate. Most photoresists will adequately wet the membrane substrate surface, but wetting may depend on the membrane substrate material and particular photoresist.

The present invention can be applied to the coating of SCALPEL mask membranes with a chemically amplified photoresist. The present invention permits greater flexibility in mask processing not attainable with conventional resist coating processing techniques. Furthermore, the present invention can be used in the process of any non-rigid membrane, such as those encountered in the MEMs fabrication process, X-ray lithography masks and stencil masks (such as used for ion-beam projection lithography and PREVAIL scattering masks).

Experimental data illustrates that substantially more uniform films can be made with the method of the present invention.

DETAILED DESCRIPTION

Figure 1:
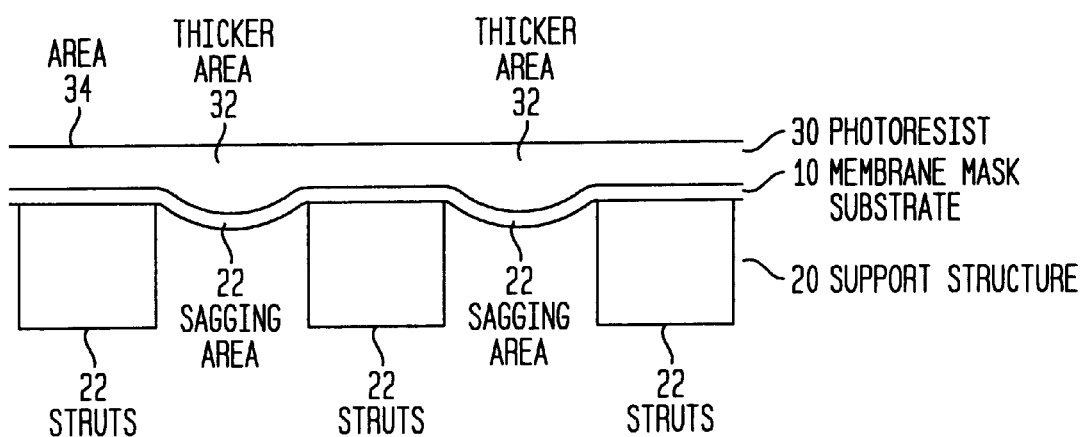
FIG. 1 illustrates a conventional membrane mask and support structure.
Figure 2:
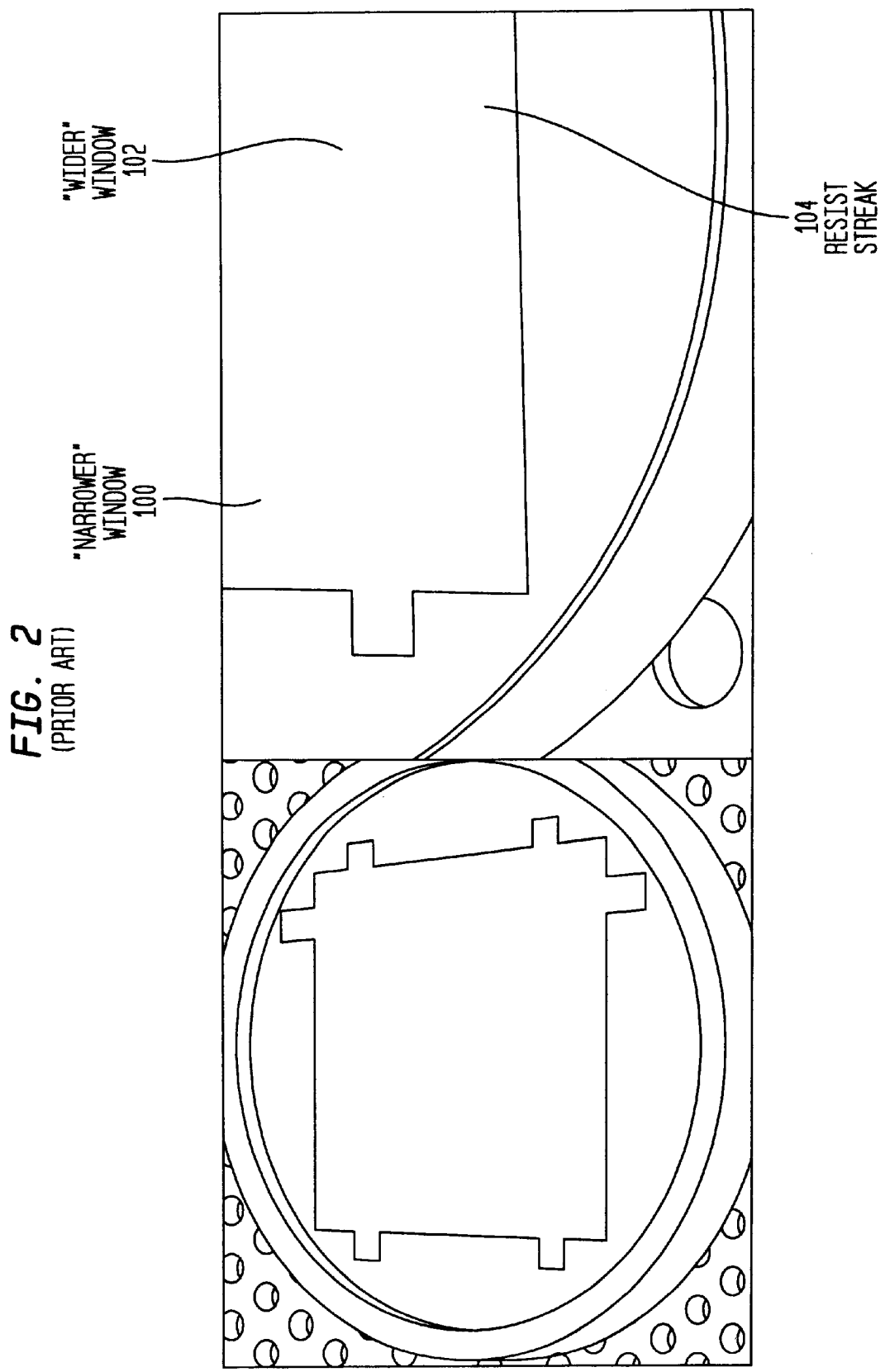
FIGS. 2 and 3 illustrate masks made by a conventional spin coat process.
Figure 3:
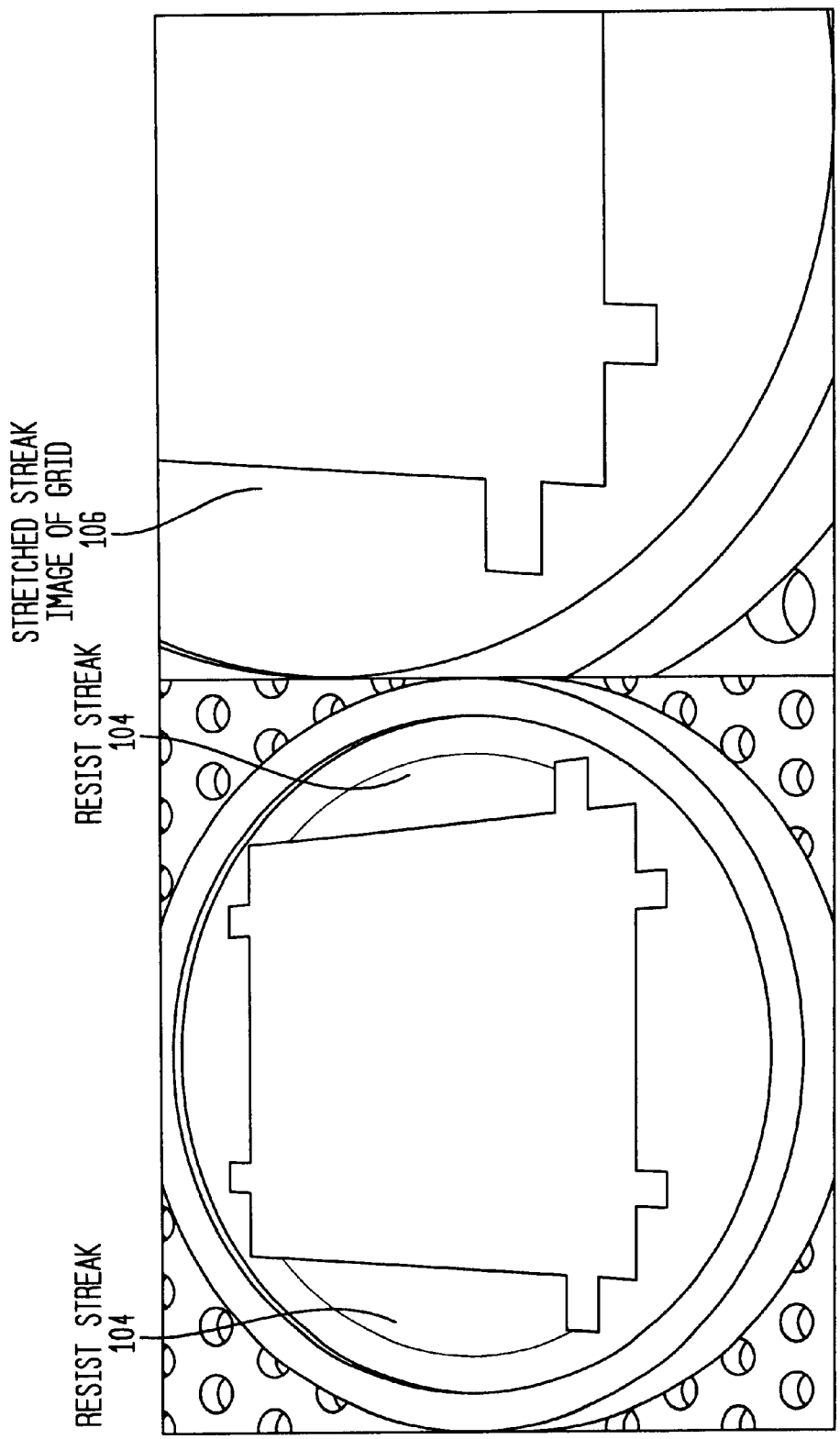
Figure 4A:
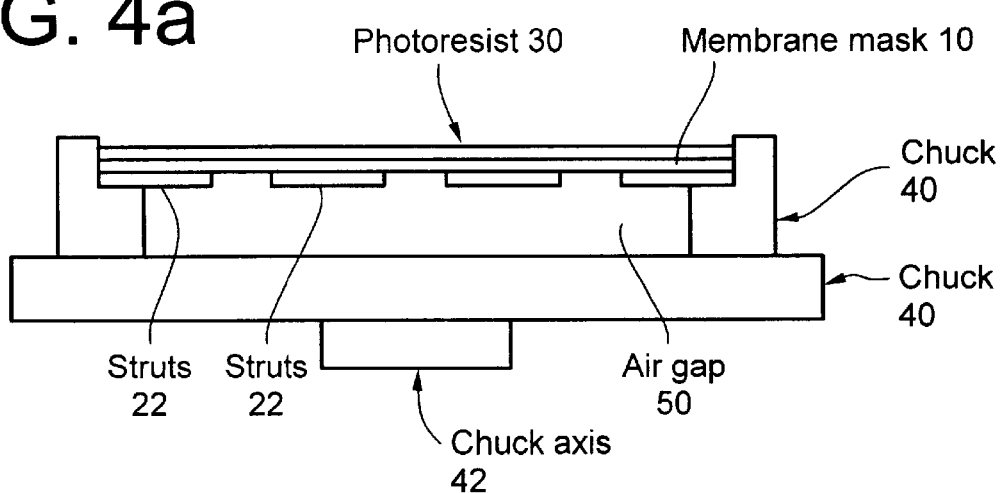
FIGS. 4a–4c illustrate the method of the present invention in one exemplary embodiment.
Figure 4B:
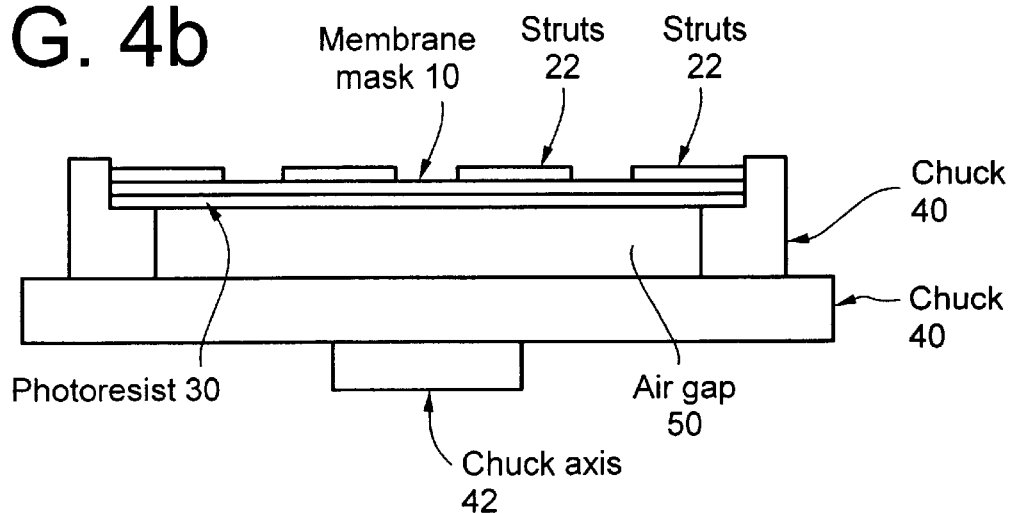
Figure 4C:
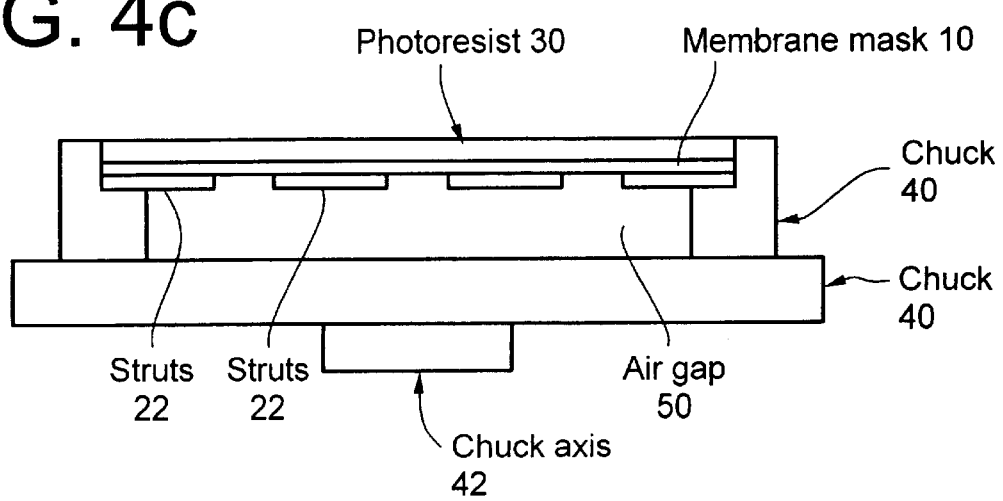

FIGS. 4a–4c illustrate the method of the present invention in one exemplary embodiment. As illustrated in FIG. 4a, a layer of photoresist 30 is coated on a membrane mask 10, supported by struts 22. The arrangement is placed in a chuck 40, including chuck axis 42, and spun. In one exemplary embodiment, the arrangement is spun at 300–600 RPM, for 10–25 seconds, with a ramp of 100 RPM/second.

As illustrated in FIG. 4b, the arrangement is then removed from the chuck 40, flipped substantially over, re-inserted into the chuck 40 and spun again. In one exemplary embodiment, the arrangement is spun at 2800–3300 RPM, for 10–15 seconds, with a ramp of 100 RPM/second.

An optional additional step is illustrated in FIG. 4c. The arrangement is flipped again, reinserted in the chuck 40 and spun again at a speed slower than the flipped spin. This spin is to dry the photoresist layer 30. In one exemplary embodiment, the arrangement is spun at 2000–2800 RPM, for 10–45 seconds, with a ramp of 200–250 RPM/second.

It is noted that the speeds set forth above for the coat, spin, and dry steps are exemplary and faster or slower speeds may be utilized, depending on the desired layer thickness and other features, as would be apparent to one of ordinary skill in the art.

Figure 5:
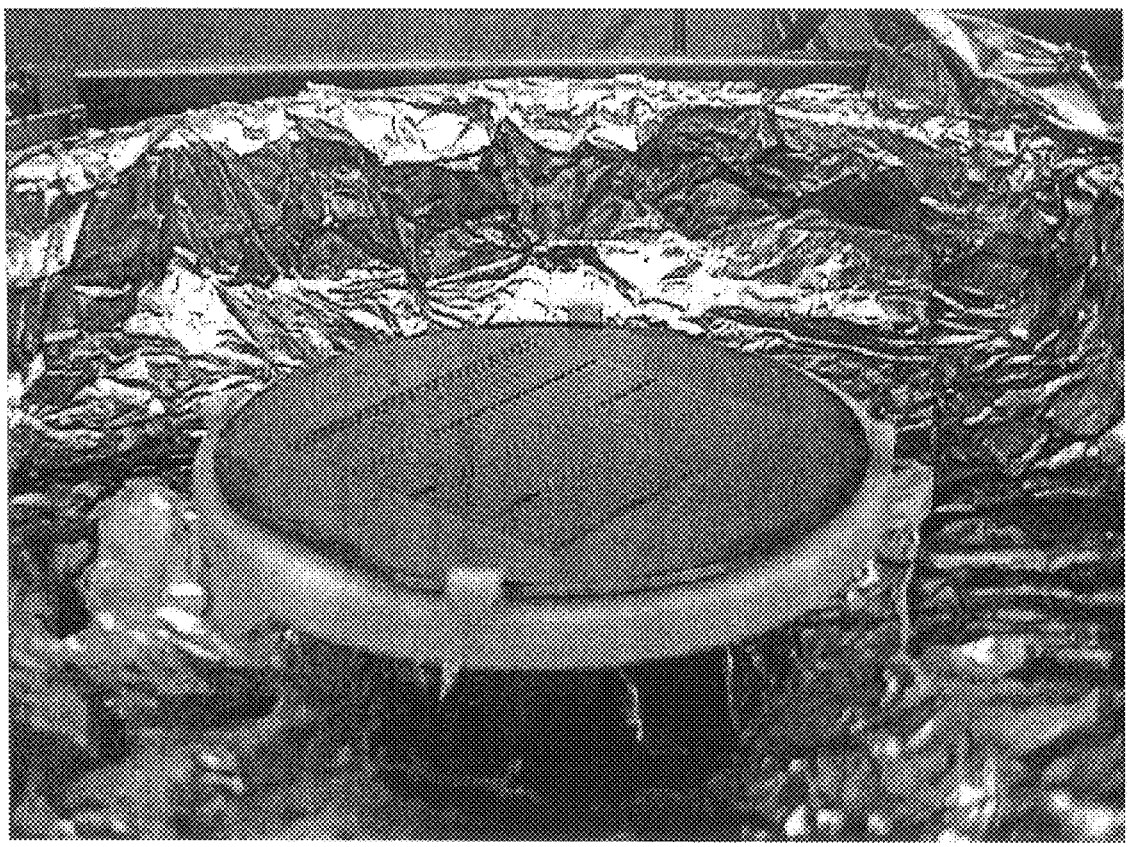
FIGS. 5–6 illustrate masks made by the method of the present invention.

FIG. 5 illustrates a mask made by the flip-spin process of the present invention. In particular, FIG. 5 illustrates a SCALPEL (a membrane-thick substrate system) mask mounted upside down on a chuck that leaves the membrane airborn.

Because there is a small gap between the membrane mask 10 and the chuck surface, there is film spread but very little drying effect. The third step described above may then be employed, where the membrane-thick substrate support system is flipped over again and subject to a moderate spin to dry the photoresist 30 but not spread the photoresist 30 any further.

Examples of spin recipes include:

|  | Speed | Time | Ramp |
|---|---|---|---|
| Coat: | 0–600 RPM | 20–25 sec | 100 RPM/s |
| Spin: | 0–3300 RPM | 10–25 sec | 1000 RPM/s |
| Dry: | 0–2000 RPM | 10–25 sec | 250 RPM/s |

An additional feature of the process of the present invention is the use of dynamic dispense with solvent pre-wet. During the coating step, solvent may be applied over the membrane mask 10, and before the solvent dries, the photoresist 30 is applied. This is done for two reasons. The solvent pre-wet reduces the effect of surface tension between the membrane mask 10 and the photoresist 30 and then the photoresist 30 is uniform, but still not dry by the time the flip step begins.

In order to avoid film "stretching" during the dry stage, it may be advantageous to use a slower spin speed for the dry step than the spin step.

Figure 6:
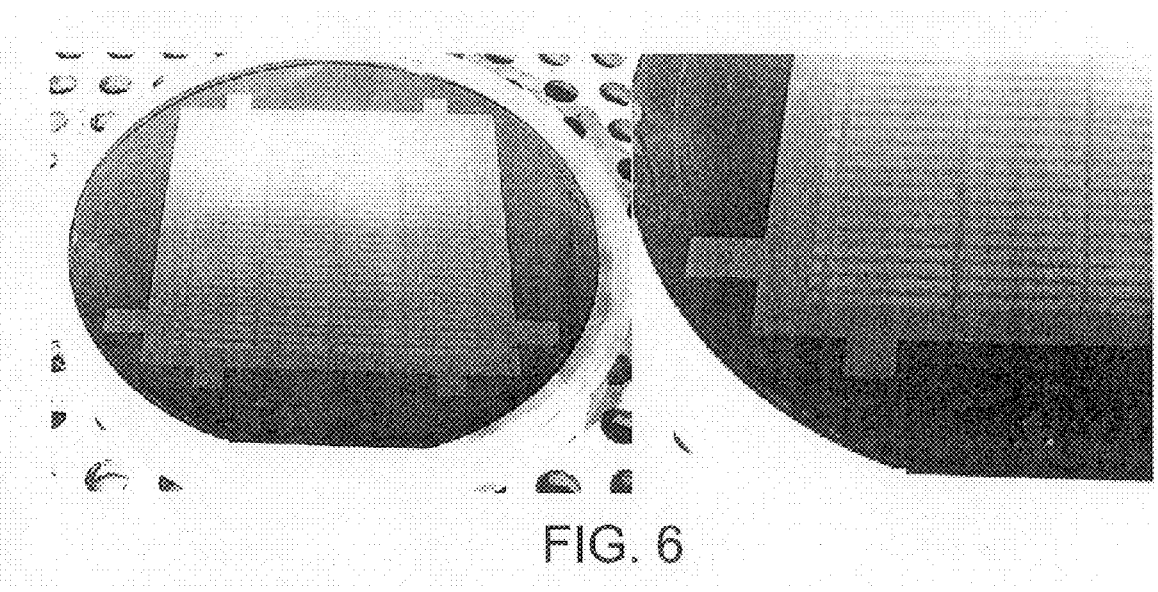

FIG. 6 illustrates the result of patterning using the optional spin step in the flip-spin process of the present invention. No shifts are observed. The streaks at the edges are the result of turbulence at the four posts of the chuck, which keep the membrane mask 10 in place during the spin. These streaks can be reduced with a better chuck design and do not have any effect on the membrane area.

As set forth above, the method of the present invention counters the negative effects of a sagging membrane during film spread and drying by spinning the resist during the film spread stage substantially upside down. The spin cast film will not fall from the membrane because surface tension forces keep the spin cast film in place. Further, with a small initial spread step the film will not drip nor move while the arrangement is flipped over. The membrane will not break because the arrangement is held at the edges, leaving the membrane areas airborne.

Thickness uniformity data has been collected for both the conventional spin process and the flip-spin process of the present invention. A chemically amplified photoresist was used as the spin cast material in the experiments conducted to obtain the thickness uniformity data.

Figure 7A:
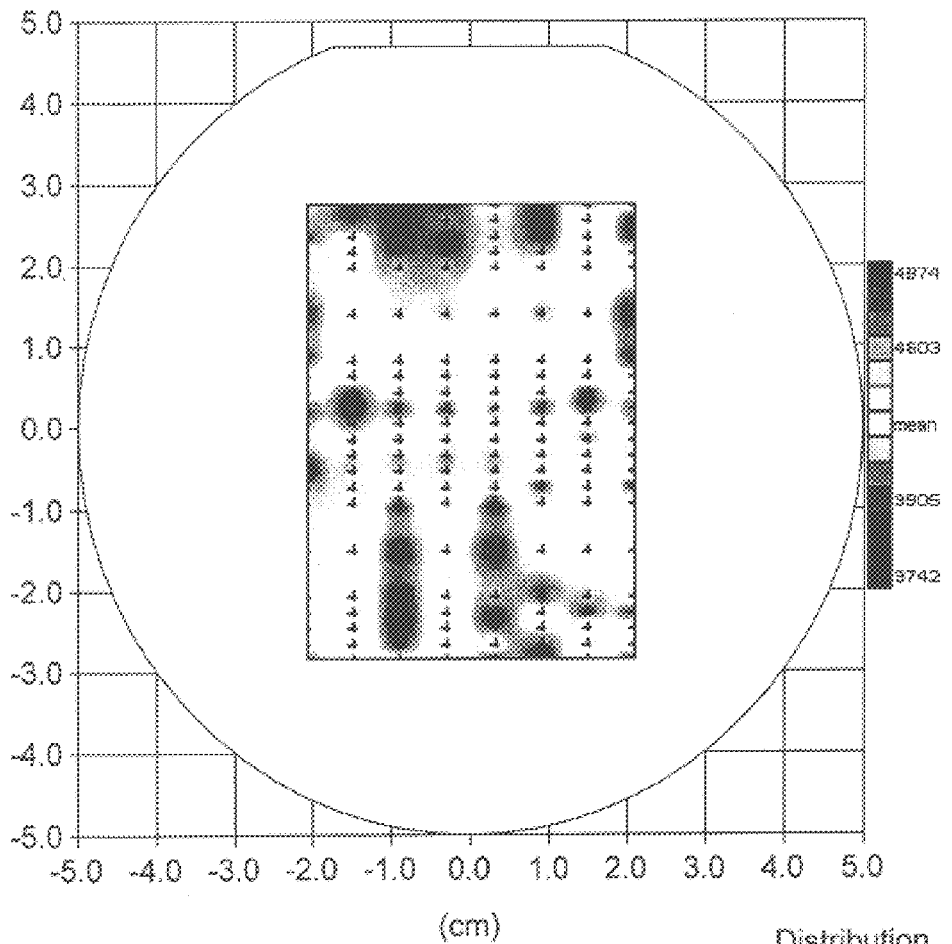
FIG. 7 illustrates a comparison of film thickness variations of a mask made by a conventional method and a mask made by the method of the present invention.
Figure 7A:
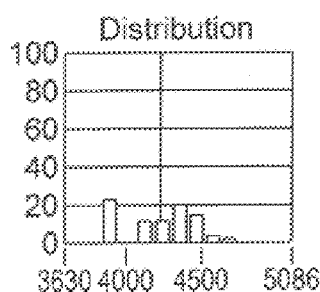

Tests were performing comparing the method of patterning a membrane of the present invention with conventional techniques. In these comparison tests, the same membrane mask was used, the same resist was used, similar spin speeds were used, and both used dynamic dispense with solvent pre-wet. Results from a N&K Analyzer 1580, illustrated in FIG. 7, show conclusively that the method of patterning a membrane of the present invention reduces the film thickness variation by half (a standard deviation of 248 nm vs. 122 nm). As a result, the method of patterning a membrane of the present invention is useful as a process for casting membrane structures supported by a stiff substrate, and more specifically, for membrane-based masks, such as non-rigid membranes (such as those encountered in the MEMs fabrication process), X-ray lithography masks and stencil masks (such as used for ion-beam projection lithography and PREVAIL scattering masks) coated by photoresists, including amplified resists. Examples of the photoresists includes any chemically amplified photoresist, such as spin casting materials, including polyimides and dielectrics, positive type and negative type phenolic-based resists, DUV resists, solvent-based resists, and e-beam resists, such as ZEP7000, UV6, and XP9947A4.

In general, the process of the present invention may be applied to any spin casting material that coats a thin membrane that has a supporting arrangement, similar to that described above.

An additional advantage of the present invention is that the possibility of casting membrane-based masks with membranes present sing flexibility and also mask rework, as long as there is no pattern transfer.

The invention being thus described, it will be obvious that the same may be varied in many ways. Such variations are not to be regarded as a departure from the spirit and scope of the invention, and all such modifications as would be obvious to one skilled in the art are intended to be included within the scope following claims.

What is claimed:

1. A process for coating a non-rigid membrane in a closed gap environment, comprising:

applying a layer of an energy-sensitive composition to the non-rigid membrane;

spinning the non-rigid membrane;

inverting the non-rigid membrane with the layer of an energy-sensitive composition; and spinning the inverted non-rigid membrane;

wherein the resulting layer of the energy-sensitive composition has a substantially uniform thickness as a result of said inverting and said inverted spinning.

2. The process for coating a non-rigid membrane of claim 1, further comprising:

re-inverting the non-rigid membrane; and spinning the re-inverted, non-rigid membrane.

3. The process for coating a non-rigid membrane of claim 2, wherein during said re-inverted spinning, the energy-sensitive composition is dried.

4. The process for coating a non-rigid membrane of claim 2, wherein said re-inverted spinning is performed at a slower speed than said inverted spinning.

5. The process for coating a non-rigid membrane of claim 1, further comprising:

before said applying, applying a solvent to the non-rigid membrane.

6. The process for coating a non-rigid membrane of claim 3, wherein the solvent pre-wets the non-rigid membrane.

7. The process for coating a non-rigid membrane of claim 1, wherein during said spinning, the energy-sensitive composition begins to spread on the non-rigid membrane.

8. The process for coating a non-rigid membrane of claim 1, wherein during said inverted spinning, the energy-sensitive composition is completely spread on the non-rigid membrane.

9. The process for coating a non-rigid membrane of claim 1, wherein the energy-sensitive composition is a photoresist.

10. The process for coating a non-rigid membrane of claim 9, wherein the photoresist is a chemically amplified photoresist.

11. The process for coating a non-rigid membrane of claim 9, wherein the photoresist is one of a spin casting material, including polyimides and dielectrics, positive type and negative type phenolic-based resists, DUV resists, solvent-based resists, and electron beam resists.

12. The process for coating a non-rigid membrane of claim 1, wherein a patterned, non-rigid membrane is usable as a lithography or stencil mask.

* * * * *